US012676451B2

(12) United States Patent
Manegatti et al.

(10) Patent No.: US 12,676,451 B2
(45) Date of Patent: Jul. 7, 2026

(54) OPTOELECTRONIC COMPONENT

(71) Applicants: CENTRE NATIONAL DE LA RECHERCHE SCIENTIFIQUE, Paris (FR); UNIVERSITE PARIS CITE, Paris (FR); UNIVERSITE PARIS-SACLAY, Gif-sur-Yvette (FR)

(72) Inventors: Francesco Manegatti, Ivry-sur-seine (FR); Dorian Sanchez, Palaiseau (FR); Fabrice Raineri, Paris (FR)

(73) Assignees: CENTRE NATIONAL DE LA RECHERCHE SCIENTIFIQUE, Paris (FR); UNIVERSITE PARIS CITE, Paris (FR); UNIVERSITE PARIS-SACLAY, Gif-sur-Yvette (FR)

( * ) Notice: Subject to any disclaimer, the term of this patent is extended or adjusted under 35 U.S.C. 154(b) by 556 days.

(21) Appl. No.: 18/252,509

(22) PCT Filed: Nov. 12, 2021

(86) PCT No.: PCT/EP2021/081463
§ 371 (c)(1),
(2) Date: May 10, 2023

(87) PCT Pub. No.: WO2022/101380
PCT Pub. Date: May 19, 2022

(65) Prior Publication Data
US 2024/0022041 A1 Jan. 18, 2024

(30) Foreign Application Priority Data
Nov. 16, 2020 (FR) ...................................... 2011715

(51) Int. Cl.
*H01S 5/11* (2021.01)
*H01S 5/02* (2006.01)
(Continued)

(52) U.S. Cl.
CPC .............. *H01S 5/026* (2013.01); *H01S 5/021* (2013.01); *H01S 5/0421* (2013.01); *H01S 5/2228* (2013.01); *H01S 5/3054* (2013.01)

(58) Field of Classification Search
CPC ........ H01S 5/026; H01S 5/021; H01S 5/0421; H01S 5/2228; H01S 5/3054; H01S 5/1032; H01S 5/04257; H01S 5/11
See application file for complete search history.

(56) References Cited

U.S. PATENT DOCUMENTS 7,228,042 B2 * 6/2007 McNab .................. B82Y 20/00
385/27
2008/0273832 A1 11/2008 Kiyota et al.
(Continued)

FOREIGN PATENT DOCUMENTS

CN 203519866 U * 4/2014
WO 2016207495 A1 12/2016

OTHER PUBLICATIONS

Translation of CN 203519866U.*
(Continued)

*Primary Examiner* — Xinning(Tom) Niu
(74) *Attorney, Agent, or Firm* — Greer, Burns & Crain, Ltd

(57) ABSTRACT

An optoelectronic component for integration into an opto-electronic circuit includes a III-V semiconductor membrane, a P-doped layer, an intrinsic layer deposited on the P layer, and an N-doped layer, deposited on the intrinsic layer; an asymmetrical photonic crystal waveguide, formed in the membrane by a two-dimensional photonic crystal on one longitudinal side and by a face with total internal reflection on the other longitudinal side; contacts arranged on either side of the PhC waveguide, for injecting electrical charge carriers into the PhC waveguide laterally with respect to the membrane; the layers arranged such that the intrinsic and N
(Continued)

a)

b)

layers only partially cover the P layer, forming a side face extending perpendicularly from the surface of the P layer, a portion of the side face forming the face with total internal reflection of the PhC waveguide; the PhC waveguide is evanescently coupled to a passive semiconductor waveguide in a coupling region.

15 Claims, 4 Drawing Sheets

(51) Int. Cl.

| | |
|---|---|
| *H01S 5/026* | (2006.01) |
| *H01S 5/042* | (2006.01) |
| *H01S 5/22* | (2006.01) |
| *H01S 5/30* | (2006.01) |

(56) References Cited

U.S. PATENT DOCUMENTS

| | | | | |
|---|---|---|---|---|
| 2010/0316342 | A1* | 12/2010 | Casey | B29D 11/00663 |
| | | | | 385/129 |
| 2018/0175585 | A1* | 6/2018 | Crosnier | H01S 5/11 |
| 2020/0303890 | A1* | 9/2020 | Kim | H01S 5/4062 |

OTHER PUBLICATIONS

International Search Report and Written Opinion received for PCT/EP2021/081463, mailed Feb. 3, 2022.

French Search Report received for Application No. 2011715, dated Jul. 29, 2021.

Chen, H., et al., "High speed hyprid silicon evanescent Mach-ehnder modulator and switch," Optics Express, vol. 16, No. 25, Dec. 8, 2008, pp. 20571-20576.

Fang, A., et al., "Electrically pumped hybrid AlGaInAs-silicon evanescent laser," Optics Express, vol. 14, No. 20, Oct. 2, 2006, pp. 9203-6210.

Matsuo, S., et al., "Room-temperature continuous-wave operation of lateral current injection wavelength-scale embedded active-region photonic-crystal laser," Optics Express, vol. 20, No. 4, Feb. 13, 2012, pp.

Nozaki, K., et al., "Ultralow-energy electro-absorption modulator consisting of InGaAsP-embedded photonic-crystal waveguide," APL Photonics 2, May 1, 2017, pp. 056105-1 to 056105-11.

Nozaki, K., et al., "Photonic-crystal nano-photodetector with ultrasmall capacitance for on-chip light-to-voltage conversion without an amplifier," Optica, vol. 3, No. 5, May 2016, pp. 483-491.

Park, H., et al., "A Hybrid AlGaInAs-Silicon Evanescent Ampli-fier," IEEE Photonics Technology Letters, vol. 19, No. 4, Feb. 15, 2017, pp. 230-232.

* cited by examiner

[Fig. 1]
a)
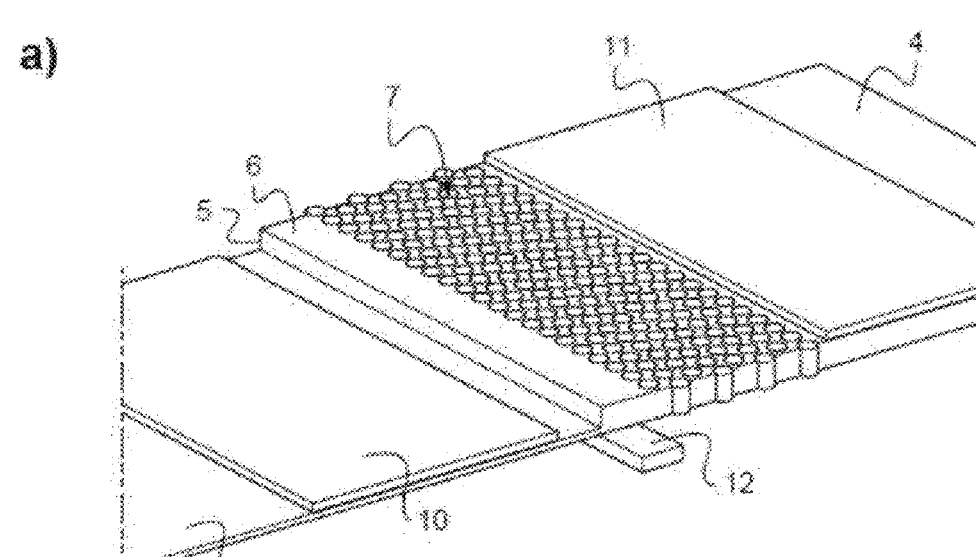
b)
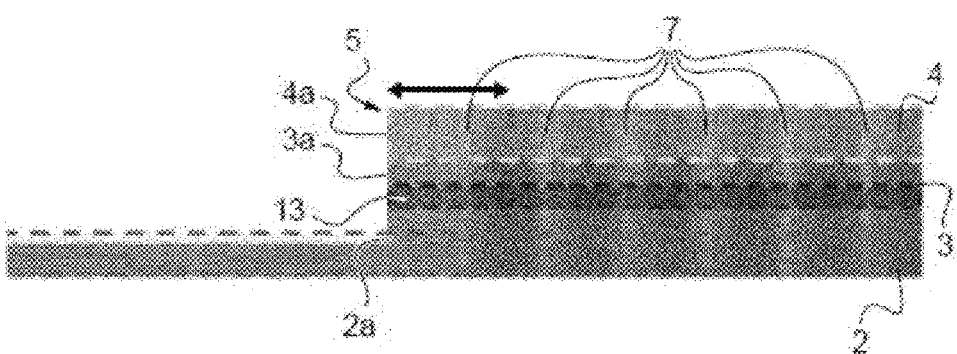

[Fig. 2]
a)
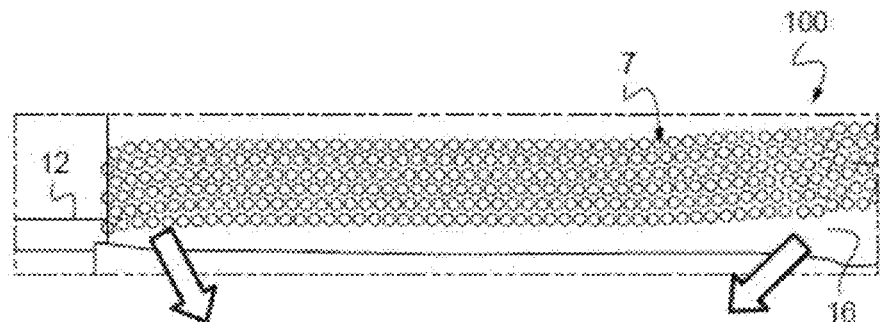
b)
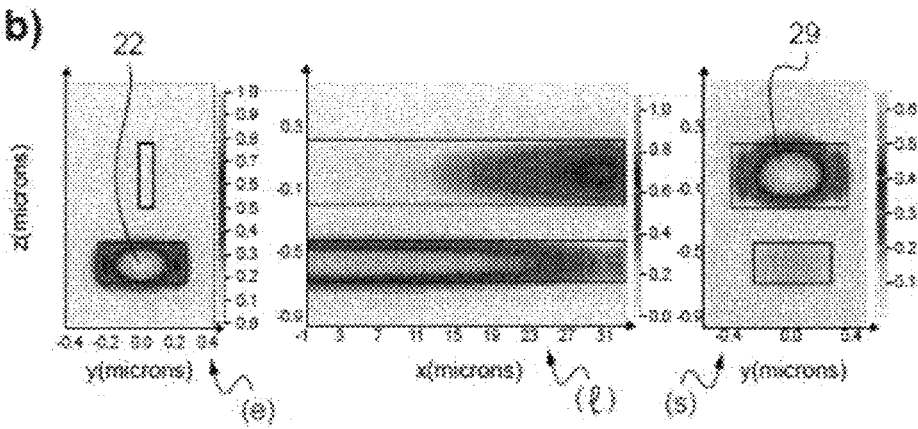
[Fig. 3]
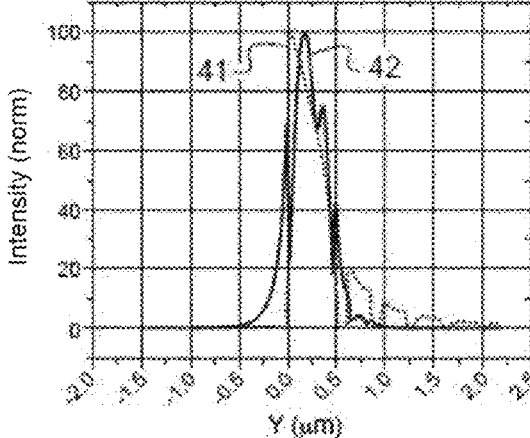
[Fig. 4]

[Fig. 5]
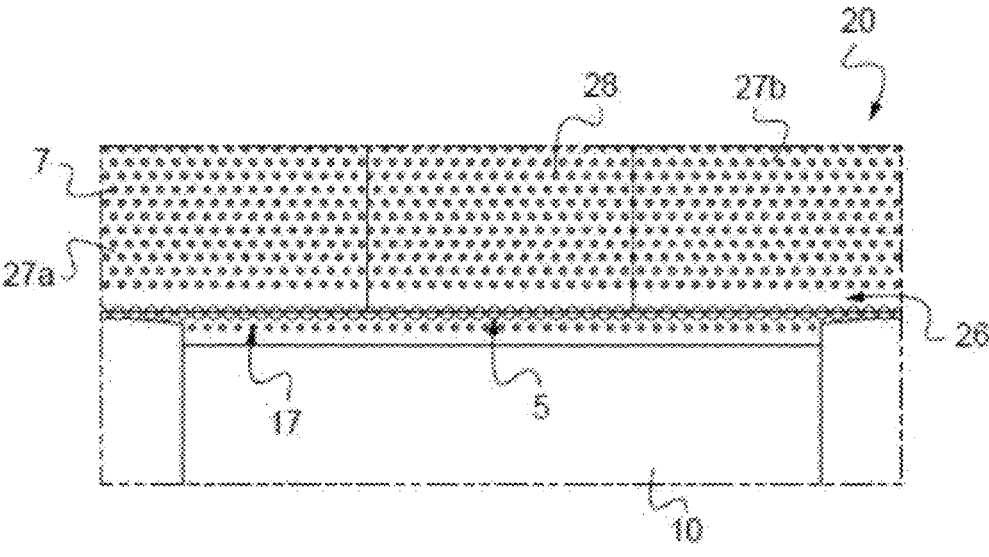
[Fig. 6]
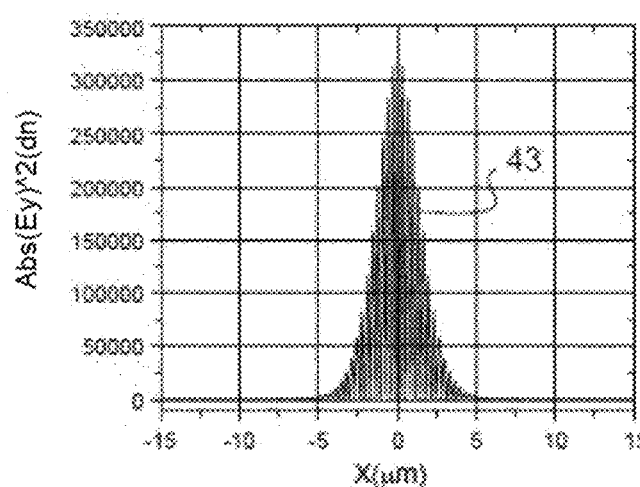
[Fig. 7]
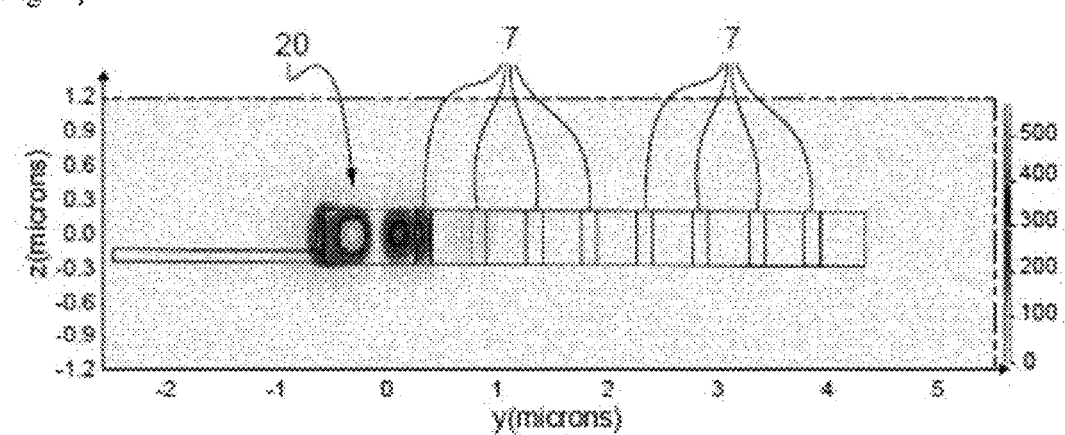

[Fig. 8]
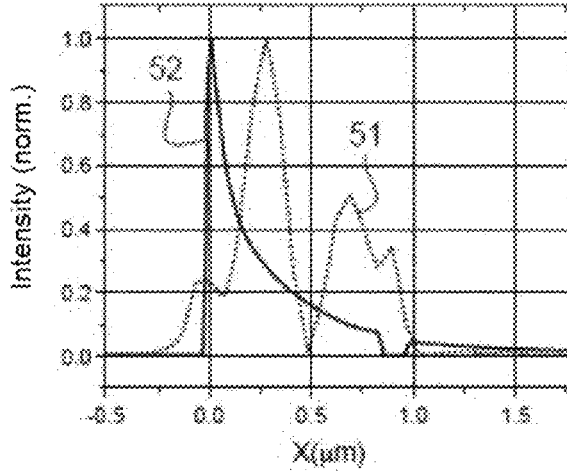
[Fig. 9]
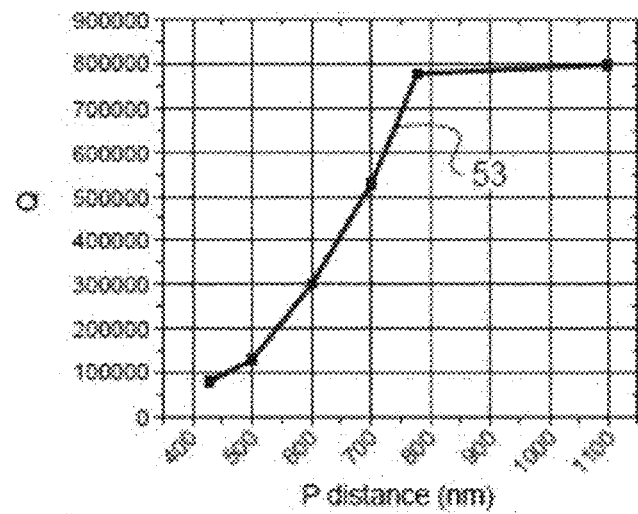
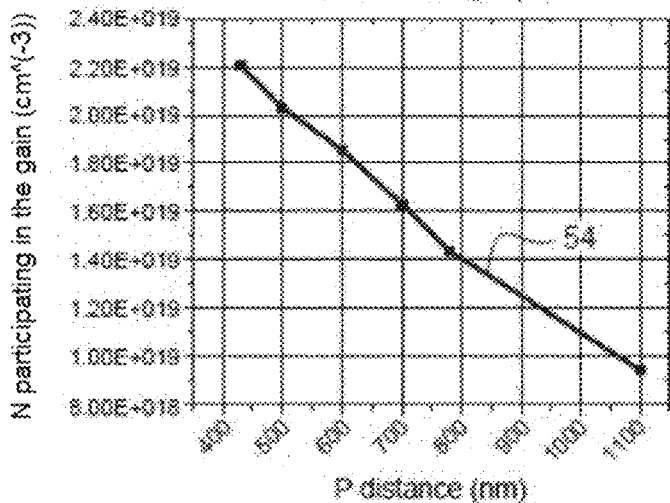

OPTOELECTRONIC COMPONENT

BACKGROUND

The present invention relates to an optoelectronic component suitable for being integrated into an optoelectronic circuit, as well as such an optoelectronic circuit.

The field of the invention is, non-limitatively, that of the optoelectronic components for the information and communication technologies.

Optoelectronic components, such as laser sources, light amplifiers, photodetectors or optical modulators, are generally fabricated from massive crystals of III-V semiconductors. Apart from lasers of the VCSEL (vertical cavity surface-emitting laser) type, their typical length is of the order of one millimetre. The electrical power necessary to drive these components is of the order of several hundred mW. These characteristics limit the integration density of these components in an optoelectronic circuit.

Optoelectronic components including in particular structures of the "ribbon" waveguide type, the cross section of which is of several $\mu m^2$ (~10 $\mu m^2$), having a length of approximately 1 mm, integrated on silicon, have been developed. Such components are described, for example, in documents [1-3]. By design, these components only provide a reduced interaction of the light with the gain, or active, material of the waveguide, thus limiting their energy efficiency.

In order to reduce the dimensions of these objects, it is possible to make use of nanophotonics concepts, where the light is confined within volumes comparable to the order of magnitude of its wavelength in the semiconductor material of the waveguide. However, the fabrication of such optoelectronic components based on nanophotonic concepts is very complex.

Examples of such nanophotonic components are described in documents [4] (laser), [5] (photodetector), [6] (modulator). The technology used is based on producing a lateral p-i-n junction by implanting the dopants of the p and n layers. However, this technology is complex to implement and in particular calls on unique epitaxy know-how for localizing the active material in the desired zones. High-temperature annealing procedures are also necessary for activation of the implanted dopants. This has significant drawbacks. Firstly, it is very difficult to integrate these components into optical circuits based on silicon photonics. In fact, the heterogeneous integration of these components in an Si photonic circuit, making use of a substrate transfer technology, is very complex, or even impossible, due to the difference in the coefficients of thermal expansion of the different materials involved during significant heating, in particular during annealing. Secondly, the technology cannot be implemented directly on microelectronic circuits, as the latter cannot be exposed to temperatures exceeding 400° C.

The aim of the present invention is to have available an optoelectronic component making it possible to overcome at least one of the drawbacks described.

[1] A. W. Fang et al, Opt. Express 16, 4413 (2008)
[2] H. Park et al, IEEE Photon. Technol. Lett. 19, 223032 (2007)
[3] H.-W. Chen et al, Opt. Express 16, 20571-76 (2008)
[4] S. Matsuo et al, Opt. Express 20, 3773-80 (2012)
[5] K. Nozaki et al, Optica 3(5), 483-492 (2016)
[6] K. Nozaki et al, APL Photonics, 2, 056105 (2017)

SUMMARY

A subject of the present invention is to propose an optoelectronic component that is very compact, capable of being densely integrated into a photonic circuit.

Another subject of the present invention is to propose an optoelectronic component having low energy consumption.

Yet another aim of the present invention is to propose an optoelectronic component the fabrication of which is compatible with CMOS technology (acronym for "complementary metal-oxide semiconductor").

This objective is achieved with an optoelectronic component suitable for being integrated into an optoelectronic circuit, the component comprising:

a III-V semiconductor membrane comprising:

a p-doped layer, called the p layer, an intrinsic layer deposited on the p layer, and an n-doped layer, called n layer, deposited on the intrinsic layer;

an asymmetric photonic crystal waveguide, called PC waveguide, formed in the membrane by a two-dimensional photonic crystal on one longitudinal side and by a face with total internal reflection on the other longitudinal side;

electrical contacts arranged on one side and on the other side respectively of the PC waveguide in the plane of the membrane, adapted for injecting electrical charge carriers into the PC waveguide laterally with respect to the membrane;

the layers being arranged such that the intrinsic and n layers only partially cover the p layer, forming a lateral face extending perpendicularly from the surface of the p layer, a portion of the lateral face forming the face with total internal reflection of the PC waveguide; and the PC waveguide being arranged to be evanescently coupled to a passive semiconductor waveguide in at least one coupling region.

The optoelectronic component according to the present invention constitutes a fundamental element for designing specific optoelectronic components capable of being integrated into optoelectronic circuits. The invention thus proposes a unique design scheme for an optoelectronic component, having an active nanophotonic structure consisting of an asymmetrical photonic crystal (PC) waveguide fabricated in a III-V semiconductor membrane. This active structure is coupled to a passive waveguide, adapted for propagating optical information in a photonic circuit.

A portion of the lateral face, or rib, represents the face with total internal reflection of the PC waveguide.

The electromagnetic field present in the component according to the present invention is strongly confined in the PC waveguide, the component benefits from a lower energy consumption with respect to the optoelectronic components of the state of the art.

By virtue of the arrangement of the electrical contacts on one side and on the other side of the PC waveguide in the plane of the membrane, and by virtue of the rib, the optoelectronic component according to the invention allows for lateral, rather than vertical, charge carrier injection. Injection into the membrane is thus carried out efficiently. Thus, the thickness of the membrane can be minimized (less than 500 nm), while avoiding absorptions of the guided light in the PC waveguide by the metal of the contacts. The footprint of such a component on a photonic circuit can then be reduced while still increasing the light confinement factor.

By virtue of its very compact structure, several of these optoelectronic components according to the invention can be densely integrated in photonic circuits. Thus, the reduced size of the component makes it possible to increase the light-material interaction. In fact, the confinement factor defined as the spatial overlap of the light intensity with the light-emitting material typically increases from a few percent in the case of a ribbon-type waveguide configuration, to over 15% in the case of the invention. It is then possible to reduce the electrical power consumed. In addition, the size reduction makes it possible to reduce the electrical capacity of the component, allowing an increase in its working frequency.

Optoelectronic components according to the invention make it possible in particular to co-integrate photonic and electronic circuits. Light can thus be used as a carrier of information through electronic circuits, in order to be able to replace metallic interconnections, at least partially, by ultra-fast photonic connections. The energy efficiency and the speed of such co-integrated components are greatly improved with respect to the circuits of the state of the art.

Hereinafter, the region between the PC and the total internal reflection face in the intrinsic layer can be called "active region".

Fabrication thereof can be compatible with the CMOS technology used for the fabrication of electronic components and of logic circuits. This is possible due to the fact that during fabrication, only temperatures compatible with CMOS technology (<400° C.) are used.

Advantageously, a p contact can be arranged on the p layer opposite the lateral face and an n contact can be arranged on the n layer adjacently to the photonic crystal, such that the contacts are arranged parallel to the PC waveguide.

By virtue of this particular arrangement, the two electrical contacts are deposited on the same side of the optoelectronic component, on the other side with respect to the passive waveguide to which it can be coupled, thus facilitating the fabrication of the component.

This arrangement also allows an efficient injection of charge carriers. When a voltage is applied to the electrical contacts, electrons are displaced in the n-doped layer through the PC region to reach the active region, and carriers from the p contact are displaced in the p-doped layer towards the active region. The resistivity of the PC region is higher than that of the massive material without PC. Thus, the carriers from the p contact have a shorter effective route than the electrons. Adjustment of the volume passed through by the charge carriers then makes it possible to attenuate the problem of unequal mobility between electrons and holes.

Alternatively, the p contact can also be arranged under the p layer. In this case, the p contact is between the p layer and the Si of the passive circuit.

According to an embodiment, the photonic crystal can be formed by holes extending through the n layer, the intrinsic layer and the p layer, the holes forming a two-dimensional periodic grating.

Advantageously, the PC waveguide can comprise a gain region.

According to an example, the gain region can comprise quantum wells and/or quantum dots.

The presence of the quantum wells and/or dots makes it possible to localize the stimulated emission process, when the light is propagated in the PC waveguide and charge carriers are injected into the active region. The result thereof is an optical amplification.

According to an embodiment, the width of the PC waveguide can vary progressively in the at least one region of coupling to the passive waveguide.

This makes it possible to progressively adjust the effective index of a guided mode in the PC waveguide, so as to reduce the difference in effective index between the PC waveguide and the passive waveguide. The result thereof is an efficient coupling without losses and reflections.

Advantageously, the respective distance of the electrical contacts with respect to the PC waveguide can be inversely proportional to the width of the PC waveguide.

The electrical resistance thus remains constant along the PC waveguide.

According to an embodiment, the PC waveguide can comprise a region having a slow-light regime, in which the photonic crystal comprises a local perturbation.

In fact, when the speed of propagation of the light in the PC waveguide is slowed down, the light-material interaction time is increased. It is then possible to obtain the same amplification as a rapid-regime amplifier but with an amplifier having a shorter group index factor than a rapid-regime amplifier.

According to an example, the PC waveguide can comprise two regions having a fast-light regime, arranged respectively upstream and downstream of the region having the slow-light regime.

The regions having a fast-light regime contribute to the mode conversion of the guided light in the passive waveguide to a guided mode in the region having a slow-light regime.

According to an advantageous embodiment of the optoelectronic component according to the invention, a resonant optical cavity is formed in the PC waveguide by two mirror regions arranged in the direction of propagation of the PC waveguide and by a region called apodization region.

Advantageously, at least one geometric parameter of the photonic crystal in the apodization region can vary gradually between the centre and the ends of the apodization region in the direction of propagation.

According to embodiments, the component can also comprise an additional one- or two-dimensional photonic crystal adjacent to the lateral face.

This additional photonic crystal can consist of one or two additional rows of holes, arranged on the side of the lateral face of the PC waveguide. One of these additional rows can in particular be produced on the rib, the latter thus having half-holes.

The additional photonic crystal makes it possible in particular to reduce optical losses.

According to another aspect of the same invention, an optical amplifier is proposed, comprising an optoelectronic component according to the invention, configured to amplify light propagating in the PC waveguide when charge carriers are injected therein.

Such a nano-amplifier is an example of the production of a non-resonant optoelectronic component.

Other specific optoelectronic components can be designed on the basis of the non-resonant component according to the invention, in particular optical modulators or photodetectors. The design is produced by adjusting the composition of the III-V semiconductor membrane.

According to yet another aspect of the same invention, a laser source is proposed comprising an optoelectronic component comprising a resonant cavity according to the invention, the cavity comprising a gain region, or an active material.

Such a laser source is an example of the production of a resonant optoelectronic component.

Other specific optoelectronic components can be designed on the basis of the resonant component according to the invention, in particular optical modulators or photodetectors. The design is produced by adjusting the composition of the III-V semiconductor membrane.

According to yet another aspect of the same invention, an optoelectronic circuit is proposed, comprising at least one from:

an optoelectronic component,
an amplifier, and
a laser source according to the invention.

The applications of such a photonic circuit are found in the fields of signal processing, telecommunications, artificial intelligence or also sensors.

BRIEF DESCRIPTION OF THE DRAWINGS

Other advantages and characteristics will become apparent on examination of the detailed description of examples that are in no way limitative, and from the attached drawings in which:

FIG. 1(*a*) shows a top perspective view and FIG. 1(*b*) shows a vertical cross-section of a non-limitative embodiment example of an optoelectronic component according to the invention;

FIG. 2(*a*) shows diagrammatically and FIG. 2(*b*) shows performance characteristics regarding the transfer of optical power from a passive waveguide 12 to a PC waveguide 16 of an example of a mode converter for an optoelectronic component according to an embodiment;

FIG. 3 shows examples of spatial distributions of the radiative recombinations and of a guided optical mode in a component such as shown in FIG. 2;

FIG. 4 shows diagrammatically an optoelectronic component according to an embodiment including a slow-light guide;

FIG. 5 shows a detail view of an embodiment example of a resonant optical cavity according to the invention;

FIG. 6 shows an example of longitudinal distribution of a confined Gaussian mode in an optical cavity such as shown in FIG. 5;

FIG. 7 shows an example of a spatial distribution in the transverse direction of a confined optical mode in an optical cavity such as shown in FIG. 5;

FIG. 8 shows examples of spatial distributions of a resonant mode and radiative recombinations in an optical cavity such as shown in FIG. 5; and FIG. 9 shows the intrinsic quality factor of a resonant mode and the average density of injected carriers participating in the gain as a function of the distance of the p contact with respect to the rib of the PC guide in an optical cavity such as shown in FIG. 5.

DETAILED DESCRIPTION

It is well understood that the embodiments that will be described below are in no way limitative. It is possible in particular to envisage variants of the invention comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, the elements common to several figures can retain the same reference.

FIG. 1 shows two diagrammatic views (seen in perspective (a) and cross section (b) respectively) of a non-limitative embodiment of an optoelectronic component according to the invention.

The optoelectronic component 1, shown in FIG. 1, comprises a semiconductor membrane, comprising a p-doped layer 2, called p layer, an intrinsic layer 3 deposited on the p layer 2 and an n-doped layer 4, called n layer, deposited on the intrinsic layer 3.

As shown in FIG. 1(*b*), the p layer 2 is not completely covered by the intrinsic layer 3, but has an uncovered part 2*a*. The intrinsic layer 3 is completely covered by the n layer 4. Thus, the edges 3*a*, 4*a* of the layers 3, 4, intrinsic and n, (and optionally also the edge 2*a* of a portion of the p layer) form a lateral face 5 extending perpendicularly from the surface of the p layer 2.

An asymmetrical photonic crystal (PC) waveguide 6 is fabricated in the optoelectronic component 1. As shown in FIG. 1, the PC consists of a hexagonal arrangement of circular holes 7 etched in the membrane comprising the p, n and intrinsic layers, the holes 7 thus forming a two-dimensional periodic grating. The confinement of the light in the asymmetric PC waveguide 6 is produced on a longitudinal side by the total internal reflection (TIR) on the lateral face 5 and on the other longitudinal side by the two-dimensional PC. The PC waveguide 6 thus represents a waveguide of the asymmetrical "rib" type.

In FIG. 1(*b*), the horizontal arrow indicates the width of the PC waveguide.

The semiconductor membrane is made from a III-V material. According to the operating wavelength envisaged for the component, the material can be based on GaN (visible range), GaS (near infrared) or InP (telecommunication range).

The operational wavelength of the optoelectronic component is adjusted by means of the geometric characteristics of the PC (period, diameter of the holes) and of the membrane (thickness) as well as of the choice of the III-V materials.

Electrically, the optoelectronic component 1 is a heterojunction of the p-i-n type (p-doped region-intrinsic region-n-doped region). P and n electrical contacts are placed parallel to the PC waveguide 6. As shown for the embodiment in FIG. 1, the p contact 10 is arranged parallel to and facing the lateral face 5 on the p layer 2, and the n contact 11 is arranged parallel to the last row of holes 7 of the PC, on the side opposite to the lateral face 5. The p and n contacts 10, 11 are arranged in immediate proximity to the PC waveguide 6. By way of example, the distance between the rib and the p contact can be <1 μm, and the n contact can be arranged at approximately 2 to 4 μm from the centre of the PC waveguide 6.

Powering up the electrical contacts 10, 11 makes it possible to inject electrical charge carriers in the region of the PC waveguide 6, The optoelectronic component 1 is coupled to a passive waveguide 12. In the embodiment shown, the component 1 is arranged above the passive waveguide 12 so that the PC waveguide 6 and the passive waveguide 12 are evanescently coupled in at least one coupling region. The passive wave-guide 12 is made from a silicon-based material (Si, SiN, SiO$_2$, SiON, etc.). It can form part of a passive circuitry and allow the propagation of optical information.

The arrangement of the electrical contacts 10, 11 parallel to the PC waveguide 6, in the plane of the membrane, makes it possible to inject charge carriers laterally. This makes it possible in particular to minimize the thickness of the membrane and consequently to reduce the size of the component and increase the confinement factor.

The asymmetric arrangement of the PC waveguide and of the p, n contacts takes account of the large difference in mobility between the electrons and the holes. The mobility is 80 times greater for the electrons. The radiative recom-bination of the charge carriers is firmly located within the PC waveguide 6. In fact, the p contact is produced as close as possible to the lateral face 5 of the PC waveguide 6, and the n contact is produced on the opposite side of the holes 7 of the PC. As the resistivity of the membrane provided with the PC is greater than that of the membrane without PC, the holes take a much shorter path than the electrons to reach the PC waveguide 6, making it possible to obtain an excellent spatial overlap between the optical guided mode and the radiative recombinations.

The optoelectronic component 1 as shown in FIG. 1 can be adapted to obtain resonant or non-resonant optoelectronic components.

Examples of a non-resonant component and of a resonant component will be described hereinafter.

An example of a non-resonant optoelectronic component according to an embodiment of the present invention is an optical nano-amplifier. In order to be able to use the PC guide as an amplifier, it must comprise a gain region. This gain region can be obtained, for example, by the incorpo-ration of multiple quantum wells or quantum dots.

The nano-amplifier has technical characteristics similar to the optoelectronic component described with reference to FIG. 1.

The amplifier also comprises several quantum wells or quantum dots inserted in the III-V membrane at the level of the PC, so as to create an alignment defect therein. The amplification of the light is produced, in this active material, by virtue of the stimulated emission process. When an optical signal is propagated in the PC waveguide and charge carriers are injected at the same time in the PC waveguide region, an optical amplification of the signal results from the radiative recombinations of the charge carriers. For this, the wavelength of the optical signal and that of the radiation emitted during the recombinations must be identical. This wavelength is called operating wavelength.

The geometric parameters of the PC can be chosen to obtain a single-mode waveguide at the operating wave-length. The geometric parameters can also be adjusted to modify the effective refractive index of the guided mode, the confinement factor and the gain.

According to an embodiment, the PC waveguide is coupled by evanescent waves to the passive waveguide (placed underneath in FIG. 1(*a*)). In order to produce this evanescent coupling, linear or adiabatic couplers can be used. The couplers progressively transform the confined optical mode in the passive guide into a confined optical mode in the PC guide. For this, the difference in the effective index between the two waveguides is progressively modified as a function of the propagation distance of the mode. Thus, the difference in effective index is reduced in the coupling region.

FIG. 2 (top, (a)) shows diagrammatically an example arrangement of a linear coupler 100, or mode converter (taper). The effective index of the guided mode in the PC waveguide 16 is adjusted by progressively modifying the width of the PC waveguide 16. The width of the passive waveguide 12 remains constant. By virtue of the variation in the width of the PC waveguide 16 in the region of the coupler 100, the effective index thereof is progressively adapted.

The transfer of optical power from the passive waveguide 12 to the PC waveguide 16 thus obtained is shown in FIG. 2 bottom (b). FIG. 2 (*b*) shows a simulation of the conver-sion of a guided mode 22 in the passive waveguide 12 into a guided mode 29 in the PC waveguide 16. The spatial distributions of the electromagnetic fields in the respective guides are shown in the transverse direction at input (e) and output (s) of the coupler 100, as well as in the longitudinal direction (l) over the entire length of the coupler 100.

In order to obtain optical amplification, the overlap between the intensity profile of the electromagnetic field propagating in the PC waveguide, the intensity profile of the radiative recombination and the active material (quantum wells and/or dots) is optimized. To this end, the design of the PC waveguide must be optimized. The concentration of injected charge carriers giving rise to stimulated emission events can thus be maximized.

FIG. 3 shows the superposition of the spatial distribution of the radiative recombination rate (curve 41) with that of the optical guided mode in the PC waveguide 16 (curve 42) for the component according to the embodiment in FIG. 2.

According to an embodiment, the nano-amplifier can comprise a region having a slow-light regime. To this end, the geometric parameters of the PC are chosen so that the guided mode having a slow group velocity is available at the desired wavelength.

According to an example, a local perturbation can be applied to the rows of holes of the PC the closest to the rib of the component. This local perturbation can consist of a diameter slightly different from that of the other holes or a different relative position with respect to the grating of holes. For example, the period of the holes can vary approxi-mately between 1-30%. This has the effect of reducing the group-velocity dispersion in the PC guide and thus enlarging the band of operational wavelengths of the amplifier in slow-light regime.

In order to be able to couple a guided mode into the passive waveguide in the PC guide at slow regime, it is necessary to operate the mode conversion in several steps. An example of a sequence of mode conversions is described hereinafter with reference to FIG. 4.

A linear or adiabatic converter 31, such as described with reference to FIG. 2, makes it possible to convert the guided mode in the silicon-based passive waveguide into the fun-damental mode of the PC waveguide, represented by the converter. The fundamental mode of the PC waveguide is then coupled to that of a waveguide of the ridge type 32, in which the guiding of the light operates only by total internal reflection. An additional structure 33 couples the mode of the ridge guide to the slow mode of the PC waveguide 34. The additional structure 33 consists of a PC waveguide in which the period of the PC is varied linearly in the direction of propagation of the light. The ridge waveguide 32 makes it possible to transfer the fundamental guided mode of the PC waveguide to the slow-light band of the PC waveguide 34.

The converters are arranged in inverse fashion at the output of the slow-light PC waveguide 34.

By way of example, for a non-resonant optoelectronic component operating, for example, as an optical amplifier, at a wavelength λ of 1550 nm, the period of the holes of the PC is approximately 260 nm, the holes have a radius of approximately 100 nm, the membrane has a thickness of approximately 450 nm, and the thickness of the passive waveguide circuitry is approximately 220 nm. The thickness of the membrane is given by λ/n, n being the refractive index of the membrane of 3.34.

An example of a resonant optoelectronic component according to an embodiment of the present invention will be described hereinafter. This resonant optoelectronic component has technical characteristics similar to the optoelectronic component described with reference to FIG. 1.

The resonant optoelectronic component also comprises a resonant optical cavity. FIG. 5 shows a detail view of an embodiment example of such a resonant optical cavity.

The optical cavity 20, shown in FIG. 5, is formed in the PC waveguide 26 by two mirror regions 27a, 27b arranged in the direction of propagation of the PC waveguide 26 and a region called apodization region 28. The mirror regions and the apodization region are produced in the PC. FIG. 5 also shows the lateral face 5 of the PC waveguide 26 and the p contact 10.

The optical cavity 20 can also comprise a region having an active material, possibly with quantum wells and/or dots, such as described above for the nano-amplifier.

In order to produce the mirror regions 27a, 27b and the apodization region 28a, geometric parameters of the PC, such as the period or the radius of the holes 7, the width of the guide, etc. are modified and adapted.

In the mirror regions 27a, 27b, the photonic forbidden band situated, in frequency, below the slow group velocity mode, is used to confine the mode between the mirrors, by preventing the propagation of light beyond the mirror regions 27a, 27b, respectively.

In the apodization region 28, one or more of the geometric parameters of the PC, such as the width of the guide, the period or the diameter of the holes, are gradually modified starting from the ends towards the centre of the cavity in the direction of propagation. In particular, it is possible in this way to obtain a resonant mode having a Gaussian spatial shape.

Generally, resulting from the asymmetry of the PC waveguide, there is a non-negligible transverse magnetic (TM) polarized amplitude of the confined electromagnetic field in the resonant mode, in addition to the principal transverse electric (TE) polarized amplitude. The TM-polarized amplitude is not reflected by the mirrors and is therefore not confined in the cavity, thus causing significant optical losses and preventing a high quality factor being obtained.

In order to avoid or reduce these losses, the cavity can comprise one or two additional rows of holes on the side of the lateral face, or rib, of the PC waveguide. The cavity 20 according to the embodiment shown in FIG. 5 also comprises two additional rows of holes 17 with respect to the component according to the embodiment in FIG. 1. One of these rows is produced straddling the rib 5, leaving half-holes in the lateral face, and the other one of the rows is produced in the p layer close to the rib 5.

Thus, the resonant optoelectronic component such as described in relation to FIG. 5 makes it possible to obtain a cavity with a high quality factor ($Q>10^5$). An example of a longitudinal distribution 43 of a confined Gaussian mode in the cavity 20 is shown in FIG. 6. FIG. 7 shows an example of a spatial distribution of an optical mode in the cavity 20 in the transverse direction. FIG. 8 shows the superposition of the spatial distributions of the optical mode (curve 51) and of the radiative recombinations (curve 52) in the cavity 20.

Such a resonant cavity, having a region having an active material, can in particular be used to produce a nano laser diode.

By way of example, for a resonant optoelectronic component operating, for example, as a laser source, at a wavelength λ of 1550 nm, the period of the holes of the PC is approximately 333 nm, the holes have a radius of approximately 75 nm, and the thickness of the membrane is approximately 450 nm. The thickness of the silicon-based passive circuitry is approximately 220 nm.

For the electrical injection of such a cavity, the following restrictions must be taken into account:

As shown in FIG. 7, the optical mode thus extends slightly in the transverse direction in the zone of the holes of the PC. The spatial overlap of the optical mode with the gain profile is thereby reduced (see FIG. 8). The net gain obtained may then be reduced.

The additional row(s) of holes can increase the resistivity of the p layer.

A sufficient level of electrical injection can nevertheless be achieved and thus cause the structure to lase by adjusting the distance of the metallic electrical contact of the p layer with respect to the rib of the PC guide.

The respective distance of the electrical contacts of the PC waveguide can in particular be inversely proportional to the width of the PC waveguide.

FIG. 9 shows the intrinsic quality factor Q of the resonant mode (curve 53) and the average density of injected carriers participating in the gain (curve 54) as a function of the distance of the p contact with respect to the rib of the PC guide. The result is that when said distance increases, the optical losses associated with the absorption of the metallic contact are reduced, i.e. the quality factor Q increases, but the efficiency of the injection is also reduced. It is then necessary to find a compromise, for example by modelling a laser based on these constraints.

The optoelectronic component according to the embodiments described above is a hybrid structure capable of being fabricated according to the known techniques as follows.

The semiconductor III-V heterostructure is attached on a waveguide circuitry based on the silicon (Si) material. The techniques used to produce this attachment can comprise adhesive bonding, wafer fusion, direct substrate attachment by thermocompression, etc. A layer of dielectric material (typically Sift) is inserted beforehand between the semiconductor III-V heterostructure and the waveguide circuitry based on Si in order to adjust the evanescent coupling power to the desired value. Typically, the thickness of this adjustment layer varies between 50 nm and 500 nm.

After the attachment, the semiconductor membrane is structured by using two levels of lithography followed by plasma-assisted etching, in order to produce the PC as well as the rib.

The metallic contacts located on the p and n layers are defined by lithography. The metals deposited are chosen as a function of the type of material and of doping of the layers used. Annealing of these contacts may be necessary in order to obtain ohmic contact. The annealing temperature must not exceed 400° C. to remain compatible with CMOS technology.

The structures are then encapsulated in a low-index dielectric material.

Finally, the electrical connections (vias) are opened and metallized above the metallic contacts in order to make it possible to supply the optoelectronic component with electricity.

Of course, the invention is not limited to the examples which have just been described and numerous adjustments can be made to these examples without exceeding the scope of the invention.

The invention claimed is:

1. An optoelectronic component suitable for being integrated into an optoelectronic circuit, the component comprising:

a III-V semiconductor membrane comprising:

a p-doped layer, called p layer, an intrinsic layer deposited on the p layer; and an n-doped layer, called n layer, deposited on the intrinsic layer;

an asymmetric photonic crystal waveguide, called PC waveguide, formed in the membrane by a two-dimensional photonic crystal on one longitudinal side and by a face with total internal reflection on the other longitudinal side, the two longitudinal sides being opposite to each other;

electrical contacts arranged on one side and on the other side respectively of the PC waveguide in the plane of the membrane, adapted for injecting electrical charge carriers into the PC waveguide laterally with respect to the membrane;

the layers being arranged such that the intrinsic and n layers only partially cover the p layer, forming a lateral face extending perpendicularly from the surface of the p layer, a portion of the lateral face forming the face with total internal reflection of the PC waveguide;

the PC waveguide being arranged to be evanescently coupled to a passive semiconductor waveguide in at least one coupling region.

2. The component according to claim 1, characterized in that a p contact is arranged on the p layer facing the lateral face and an n contact is arranged on the n layer adjacently to the photonic crystal, such that the contacts are arranged parallel to the PC waveguide.

3. The component according to claim 1, characterized in that the photonic crystal is formed by holes extending through the n layer, the intrinsic layer, and the p layer, the holes forming a two-dimensional periodic grating.

4. The component according to claim 1, characterized in that the PC waveguide comprises a gain region.

5. The component according to claim 4, characterized in that the gain region comprises quantum wells and/or quantum dots.

6. The component according to claim 4, characterized in that the width of the PC waveguide varies progressively in the at least one region of coupling to the passive waveguide.

7. The component according to claim 6, characterized in that the respective distance of the electrical contacts with respect to the PC waveguide is inversely proportional to the width of the PC waveguide.

8. The component according to claim 4, characterized in that the PC waveguide comprises a region having a slow-light regime in which the photonic crystal comprises a local perturbation.

9. The component according to claim 8, characterized in that the PC waveguide comprises two regions having a fast-light regime, arranged upstream and downstream respectively of the region having a slow-light regime.

10. An optical amplifier, comprising an optoelectronic component according to claim 4, configured to amplify light propagating in the PC waveguide when charge carriers are injected therein.

11. The component according to claim 1, in which a resonant optical cavity is formed in the PC waveguide by two mirror regions arranged in the direction of propagation of the PC waveguide and by a region called apodization region.

12. The component according to claim 11, characterized in that at least one geometric parameter of the photonic crystal in the apodization region varies gradually between the centre and the ends of the apodization region in the direction of propagation.

13. The component according to claim 11, characterized in that it comprises an additional one- or two-dimensional photonic crystal adjacent to the lateral face.

14. A laser source comprising a resonant optoelectronic component according to claim 11 and in which the PC waveguide comprises a gain region.

15. An optoelectronic circuit, comprising at least one from:

an optoelectronic component according to claim 1, an amplifier comprising an optoelectronic component configured to amplify light propagating in the PC waveguide when charge carriers are injected therein; and a laser source comprising a resonant optoelectronic component.

* * * * *